(12) United States Patent
Chen et al.

(10) Patent No.: US 11,228,015 B2
(45) Date of Patent: Jan. 18, 2022

(54) DISPLAY SCREENS AND DISPLAY DEVICES WITH THIN FILM ENCAPSULATION STRUCTURES

(71) Applicant: YUNGU (GU'AN) TECHNOLOGY CO., LTD., Langfang (CN)

(72) Inventors: Zheng Chen, Kunshan (CN); Zhiguang Zhou, Kunshan (CN); Shuangliang Qin, Kunshan (CN); Binglong Du, Kunshan (CN); Jingxun Zhao, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 28 days.

(21) Appl. No.: 16/824,698

(22) Filed: Mar. 20, 2020

(65) Prior Publication Data

US 2020/0235330 A1 Jul. 23, 2020

Related U.S. Application Data

(63) Continuation of application No. PCT/CN2019/073017, filed on Jan. 24, 2019.

(30) Foreign Application Priority Data

Aug. 9, 2018 (CN) .......................... 201921280247.3

(51) Int. Cl.
*H01L 29/08* (2006.01)
*H01L 51/52* (2006.01)
(Continued)

(52) U.S. Cl.
CPC ...... *H01L 51/5237* (2013.01); *H01L 21/0228* (2013.01); *H01L 21/02118* (2013.01);
(Continued)

(58) Field of Classification Search
CPC combination set(s) only.
See application file for complete search history.

(56) References Cited

U.S. PATENT DOCUMENTS 8,415,880 B2 *  4/2013  Choi ..................... H05B 33/04
                                                    313/512
8,916,397 B2   12/2014  Schmid et al.
(Continued)

FOREIGN PATENT DOCUMENTS

CN           101933173 A      12/2010
CN           105679964 A       6/2016
(Continued)

OTHER PUBLICATIONS

International Search Report dated Mar. 25, 2019 in the corresponding International application(application No. PCT/CN2019/073017).

*Primary Examiner* — Caleb E Henry
(74) *Attorney, Agent, or Firm* — Kilpatrick Townsend & Stockton

(57) ABSTRACT

The present application relates to a display screen and a display device. The display screen includes: a substrate; a display device disposed on the substrate, the display device including several film layers; and a thin film encapsulation structure disposed on a side of the display device away from the substrate, the thin film encapsulation structure including a first encapsulation film disposed on the display device, and a first atomic layer deposition film disposed on the first encapsulation film; wherein a thermal expansion coefficient of the first encapsulation film is between a thermal expansion coefficient of the film layer immediately adjacent to the first encapsulation film on the display unit and a thermal expansion coefficient of the first atomic layer deposition film.

19 Claims, 11 Drawing Sheets

(51) Int. Cl.
  *H01L 21/02* (2006.01)
  *H01L 51/00* (2006.01)
  *H01L 51/56* (2006.01)

(52) U.S. Cl.
  CPC .... *H01L 21/02266* (2013.01); *H01L 51/0008* (2013.01); *H01L 51/0097* (2013.01); *H01L 51/56* (2013.01)

(56) References Cited

U.S. PATENT DOCUMENTS

| | | | |
|---|---|---|---|
| 9,062,855 B2* | 6/2015 | Jeong | F21V 15/00 |
| 9,252,392 B2 | 2/2016 | Kumar et al. | |
| 10,147,904 B2* | 12/2018 | Popp | H01L 51/5221 |
| 2005/0248270 A1* | 11/2005 | Ghosh | H01L 51/5259 |
| | | | 313/512 |
| 2011/0140164 A1* | 6/2011 | Seo | H01L 51/5256 |
| | | | 257/100 |
| 2012/0097970 A1* | 4/2012 | Siomkos | H01L 24/48 |
| | | | 257/76 |
| 2012/0229709 A1* | 9/2012 | Heald | B81C 1/00269 |
| | | | 348/739 |
| 2013/0234148 A1* | 9/2013 | Werkhoven | H01L 21/76251 |
| | | | 257/76 |
| 2014/0138719 A1 | 5/2014 | Maindron et al. | |
| 2015/0053932 A1 | 2/2015 | Lin | |
| 2016/0204378 A1* | 7/2016 | Popp | H01L 51/5253 |
| | | | 257/40 |
| 2018/0363135 A1 | 12/2018 | Huang | |

FOREIGN PATENT DOCUMENTS

| | | |
|---|---|---|
| CN | 107403877 A | 11/2017 |
| CN | 105027316 B | 7/2018 |

* cited by examiner

DISPLAY SCREENS AND DISPLAY DEVICES WITH THIN FILM ENCAPSULATION STRUCTURES

CROSS-REFERENCES TO RELATED APPLICATIONS

This application is a continuation application for International Application PCT/CN2019/073017, titled "DISPLAY SCREENS AND DISPLAY DEVICES", filed on Jan. 24, 2019, which claims the priority benefit of Chinese Patent Application No. 201821280247.3, titled "DISPLAY SCREENS AND DISPLAY DEVICES" and filed on Aug. 9, 2018. The entireties of both applications are incorporated by reference herein for all purposes.

TECHNICAL FIELD

The present application relates to the field of display technologies.

BACKGROUND

The thin film encapsulation technology is suitable for some special occasions that cannot be achieved by related capping encapsulations, such as encapsulation of flexible organic light-emitting diode (OLED). Where the atomic layer deposition (ALD) technology is considered to be a promising encapsulation technology due to its excellent three-dimensional shape retention self-limiting growth mode. A related display screen includes a display unit and an atomic layer deposition film directly deposited on the display unit using atomic layer deposition technology. Unfortunately, there are drawbacks with existing related display screen.

SUMMARY

In view of the above, in order to solve the problem of the poor stability of the atomic layer deposition film directly deposited on the display device in the related display screen, a display screen and a display device, which are capable of improving the stability of the atomic layer deposition film, are provided.

A display screen includes:

a substrate;

a display unit disposed on the substrate, the display unit including a plurality of film layers; and a thin film encapsulation structure disposed on a side of the display unit away from the substrate; wherein the thin film encapsulation structure includes a first encapsulation film disposed on the display unit, and a first atomic layer deposition film disposed on the first encapsulation film; a thermal expansion coefficient of the first encapsulation film is between a thermal expansion coefficient of a film layer immediately adjacent to the first encapsulation film on the display unit and a thermal expansion coefficient of the first atomic layer deposition film.

Optionally, the substrate is a flexible substrate.

Optionally, the first encapsulation film is a first vapor deposition film or a first sputtering film.

Optionally, the first encapsulation film is a silicon nitride encapsulation film or a silicon oxynitride encapsulation film.

Optionally, the first encapsulation film has a thickness in a range from 20 nm to 1000 nm.

Optionally, a compressive stress of the first encapsulation film is in a range from 10 MPa to 100 MPa.

Optionally, the first encapsulation film has a roughness of 30 Å.

Optionally, the first atomic layer deposition film is a metal oxide atomic layer deposition film or a non-metal oxide atomic layer deposition film.

Optionally, the first atomic layer deposition film is any one of an aluminum oxide atomic layer deposition film, a zirconium oxide atomic layer deposition film, a silicon nitride atomic layer deposition film, and a silicon oxide atomic layer deposition film.

Optionally, the first atomic layer deposition film has a thickness in a range from 30 nm to 200 nm.

Optionally, the first atomic layer deposition film has a thickness of 50 nm, a stress of 200 MPa, and a roughness of 3 Å.

Optionally, the thin film encapsulation structure further includes a second encapsulation film disposed on the first atomic layer deposition film; the second encapsulation film includes at least one inorganic thin film layer and at least one organic thin film which are stacked; and the inorganic thin film layer is a vapor deposition film or a second atomic layer deposition film.

Optionally, the vapor deposition film has a thickness in a range from 700 nm to 1,200 nm.

Optionally, the second atomic layer deposition film has a thickness in a range from 30 nm to 200 nm.

Optionally, the organic thin film layer has a thickness in a range from 5 μm to 12 μm.

Optionally, the second encapsulation film includes two inorganic film layers, and one organic film layer disposed between the two inorganic film layers.

In addition, a display device is further provided, and the display device includes the display screen above.

In the display screen employing the technical solutions of the present application, the thermal expansion coefficient of the first encapsulation film is between the thermal expansion coefficient of the film layer immediately adjacent to the first encapsulation film on the display unit and the thermal expansion coefficient of the first atomic layer deposition film, therefore the first encapsulation film improves the interfacial properties of the film layers on both sides thereof, thereby avoiding the peeling and disintegration phenomenon of the first atomic layer deposition film due to the excessive difference between the thermal expansion coefficients of the first atomic layer deposition film and the thermal expansion coefficient of the film layer on the display unit, and improving the stability of the first atomic layer deposition film. Finally, the overall reliability of the display screen encapsulation is improved, and the yield is improved.

In the display device employing the technical solution of the present application, the first encapsulation film improves the interfacial properties of the film layers on both sides thereof, thereby avoiding the peeling and disintegration phenomenon of the first atomic layer deposition film due to the excessive difference between the thermal expansion coefficient of the first atomic layer deposition film and the thermal expansion coefficient of the film layer on the display unit, and improving the stability of the first atomic layer deposition film. Finally, the reliability of the overall encapsulation is improved, and the yield of the final product is improved.

BRIEF DESCRIPTION OF THE DRAWINGS

FIG. 3 (B) is a scanning electron microscope (SEM) image of the surface of the thin film encapsulation structure of the display screen of the second comparative example, where the surface is adjacent to the display unit;

DETAILED DESCRIPTION OF THE INVENTION

As mentioned above, there are drawback with existing related display screen technology. In a related display screen, the atomic layer deposition film directly deposited on the display unit is prone to peel and disintegrate, and the stability is poor.

Specific embodiments of the present application will be described in detail hereinafter with reference to the accompanying drawings.

It should be noted that when an element is defined to be "fixed to" another element, the element is either directly disposed on the other element, or there is an intermediate element. When an element is considered to be "connected" to another element, the element can be directly connected to the other element, or there is an intermediate element. The terms "vertical", "horizontal", "left", "right", and the like, are used herein for illustrative purpose only.

All technical and scientific terms used herein have the same meaning as commonly understood by the ordinary skilled in the art of the present disclosure, unless otherwise defined. The terms used in the specification of the present application herein are just for the purpose of describing specific embodiments, but not intended to limit the present application. The term "and/or" used in the present disclosure includes any and all combinations of one or more of the corresponding listed items.

During the production of the OLED, in the thin film encapsulation structure, the atomic layer deposition film immediately adjacent to the display unit is prone to peel and disintegrate, and the stability is poor. In the prior art, the atomic layer deposition film is directly deposited on the display unit, and the difference between a thermal expansion coefficient of the atomic layer deposition film and a thermal expansion coefficient of the film layer immediately adjacent to the atomic layer deposition film on the display unit is large, and the stress of the atomic layer deposition film is large, therefore the atomic layer deposition film is prone to peel and disintegrate.

In order to solve the above technical problems, the present application provides a display screen and a display device, which are capable of improving the stability of the atomic layer deposition film.

Figure 1:
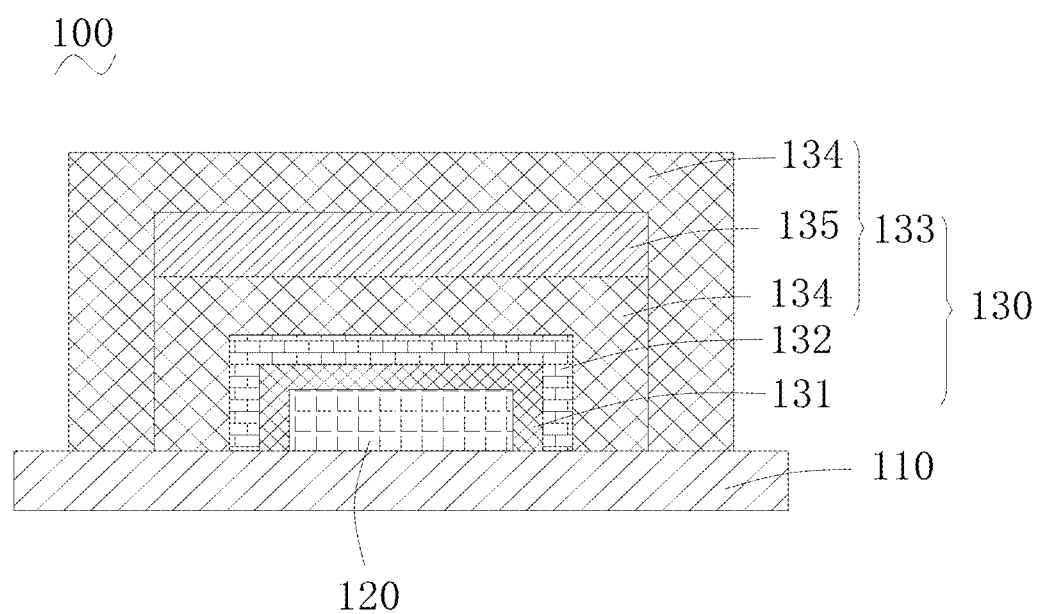
FIG. 1 is a schematic view of a display screen according to an embodiment of the present application.

Referring to FIG. 1, a display screen 100 according to an embodiment of the present application includes a substrate 110, a display unit 120, and a thin film encapsulation structure 130.

The substrate 110 is configured to support functional structures thereon, such as the display unit 120 and the thin film encapsulation structure 130. Preferably, the substrate 110 is a flexible substrate, and can be an organic polymer substrate such as a polyimide substrate (PI substrate), a polyamide substrate, a polycarbonate substrate, a polyether sulfone substrate, or the like.

The display unit 120 is disposed on the substrate 110, and the display unit 120 includes several film layers (not shown in the figures). The several film layers can be functional film layers such as an anode, a light-emitting layer, and a cathode, and the like. Preferably, the display unit 120 is a flexible Organic Light-Emitting Diode (OLED).

The thin film encapsulation structure 130 is disposed on a side of the display unit 120, where the side of the display unit is away from the substrate 110. The thin film encapsulation structure 130 includes a first encapsulation film 131 disposed on the display unit 120, and a first atomic layer deposition film disposed on the first encapsulation film 131. Where the of thermal expansion coefficient of the first encapsulation film 131 is between the thermal expansion coefficient of the film layer immediately adjacent to the first encapsulation film 131 on the display unit and the thermal expansion coefficient of the first atomic layer deposition film 132.

The first encapsulation film 131 refers to a film layer that functions as an encapsulation. The first atomic layer deposition film 132 refers to an encapsulation film layer deposited by an Atomic Layer Deposition (ALD) process. The thermal expansion coefficient describes how a size of an object changes with a change in temperature, and is given by a change in volume per degree change in temperature at a constant pressure (p).

The first encapsulation film 131 improves the interfacial properties of the film layers on both sides of the first encapsulation film, and prevents the first atomic layer deposition film 132 from being directly deposited on the display unit 120, thereby avoiding the peeling and disintegration phenomenon of the first atomic layer deposition film 132 due to an excessive difference between the thermal expansion coefficient of the first atomic layer deposition film 132 and the thermal expansion coefficient of the display unit 120, thus enhancing the stability of the first atomic layer deposition film 132.

In an embodiment, the first encapsulation film 131 is a first vapor deposition film or a first sputtering film. The first vapor deposition film refers to a film layer deposited by a chemical vapor deposition (CVD) process or a film layer deposited by a physical vapor deposition (PVD) process. The first sputtering film refers to a film layer obtained by a sputtering process.

The thermal expansion coefficient of the first vapor deposition film or the thermal expansion coefficient the first sputtering film is between the thermal expansion coefficient of the film layer immediately adjacent to the first encapsulation film 131 on the display unit 120 and the thermal expansion coefficient of the first atomic layer deposition film 132. Therefore, the interfacial properties of the film layers on both sides of the first vapor deposition film or the first sputtering film can be improved, thereby avoiding the peeling and disintegration phenomenon of the first atomic layer deposition film 132 due to the excessive difference between the thermal expansion coefficient of the first atomic layer deposition film 132 and the thermal expansion coefficient of the film layer immediately adjacent to the first encapsulation film 131 on the display unit 120, and improving the stability of the first atomic layer deposition film 132.

In an embodiment, the first encapsulation film 131 is a silicon nitride encapsulation film or a silicon oxynitride encapsulation film. The thermal expansion coefficients of these encapsulation films are between the thermal expansion coefficient of the film layer immediately adjacent to the first encapsulation film 131 on the display unit 120 and the thermal expansion coefficient of the first atomic layer deposition film 132. Therefore, the interfacial properties of the film layers on both sides of any one of these encapsulation films can be improved, thereby avoiding the peeling and disintegration phenomenon of the first atomic layer deposition film 132 due to the excessive difference between the thermal expansion coefficient of the first atomic layer deposition film 132 and the thermal expansion coefficient of the film layer immediately adjacent to the first encapsulation film 131 on the display unit 120, and improving the stability of the first atomic layer deposition film 132.

In an embodiment, the first encapsulation film 131 has a thickness in a range from 20 nm to 1000 nm; and/or a compressive stress of the first encapsulation film 131 is in a range from 10 MPa to 100 MPa. When the thickness of the first encapsulation film 131 is in the range from 20 nm to 1000 nm, the thickness of the first encapsulation film 131 is thinner, and the surface chemical interface state can be changed without changing the surface micro morphology, which is beneficial to the growth of the first atomic layer deposition film 132. When the compressive stress of the first encapsulation film 131 is in the range from 10 MPa to 100 MPa, the compressive stress of the first encapsulation film 131 is smaller, and the first encapsulation film 131 is easy to adhere to the display unit 120 of a lower layer and not easy to peel.

Furthermore, the roughness of the first encapsulation film 131 is 30 Å preferably. In such a case, the first encapsulation film is not only beneficial to the growth of the first atomic layer deposition film 132, but also can further avoid peeling.

In an embodiment, the first atomic layer deposition film 132 is a metal oxide atomic layer deposition film or a non-metal oxide atomic layer deposition film. Where the metal oxide atomic layer deposition film has a good encapsulation effect. Where the non-metal oxide atomic layer deposition film has a good property for coating particles, and is easy to clean and to be used in industrial production.

In an embodiment, the first atomic layer deposition film 132 is an aluminum oxide atomic layer deposition film, a zirconium oxide atomic layer deposition film, a silicon nitride atomic layer deposition film, or a silicon oxide atomic layer deposition film. The aluminum oxide atomic layer deposition film and the zirconium oxide atomic layer deposition film have good encapsulation effects and have good properties for coating particles. The silicon nitride atomic layer deposition film and the silicon oxide atomic layer deposition film have good property for coating particles, and are easy to clean and to be used in industrial production.

In an embodiment, the first atomic layer deposition film 132 has a thickness in a range from 30 nm to 200 nm. The first atomic layer deposition film 132 having such an thickness range has a good property for coating particles, and can prevent the particles and the like from directly contacting with the encapsulation layer thereon and damaging the encapsulation layer thereon, thereby avoiding poor encapsulation.

Preferably, the first atomic layer deposition film 132 has a thickness of 50 nm, a stress of 200 MPa, and a roughness of 3 Å, and has a perfect three-dimensional shape retention property and a good property of surface coverage, which can effectively prevent water and oxygen in the organic film layer or in the air from penetrating into the display unit 120.

In an embodiment, the thin film encapsulation structure 130 further includes a second encapsulation film 133 disposed on the first atomic layer deposition film 132. The second encapsulation film 133 includes at least one inorganic thin film layer 134 and at least one organic thin film layer 135 which are stacked. The inorganic thin film layer 134 is a vapor deposition film or a second atomic layer deposition film. Wherein, the second encapsulation film 133 is configured to encapsulate the display unit 120, so as to prevent water and oxygen from penetrating into the display unit 120. This second encapsulation film 133 has a good encapsulation effect and can effectively block external water and oxygen.

In the present embodiment, the second encapsulation film 133 includes two inorganic thin film layers 134 and one organic thin film layer 135 disposed between the inorganic thin film layers 134. Certainly, in other embodiments, the number of layers of the inorganic thin film layer 134 and the organic thin film layer 135 are not limited thereto.

For example, the second encapsulation film 133 can also be in the form of an organic thin film layer (hereinafter referred to as IJP) disposed on the first atomic layer deposition film 132 and an inorganic thin film layer (hereinafter referred to as CVD or ALD) disposed on the organic thin film layer, IJP/ALD/CVD/ALD, IJP/CVD/ALD, IJP/ALD/CVD, CVD/IJP/CVD, CVD/IJP/ALD/CVD/ALD, CVD/IJP/CVD/ALD, or CVD/IJP/ALD/CVD or the like.

In an embodiment, the vapor deposition film has a thickness in a range from 700 nm to 1200 nm; and/or the second atomic layer deposition film has a thickness in a range from 30 nm to 200 nm; and/or the organic thin film layer has a thickness in a range from 5 μm to 12 μm. In such a case, a better encapsulation effect can be achieved, thereby effectively blocking the external water and oxygen.

In the display screen employing the technical solutions of the present application, the thermal expansion coefficient of the first encapsulation film is between the thermal expansion coefficient of the film layer immediately adjacent to the first encapsulation film on the display unit and the thermal expansion coefficient of the first atomic layer deposition film, therefore the first encapsulation film improves the interfacial properties of the film layers on both sides thereof, thereby avoiding the peeling and disintegration phenomenon of the first atomic layer deposition film due to the excessive difference between the thermal expansion coefficient of the first atomic layer deposition film and the thermal expansion coefficient of the film layer on the display unit, and improving the stability of the first atomic layer deposition film. Ultimately, the overall reliability of the display screen encapsulation is improved, and the yield is improved. The yield of the display screen employing the technical solutions of the present application is improved by more than 20%.

In the display screen of the technical solutions of the present application, the first encapsulation film and the first atomic layer deposition film have better properties for coating particles, and can solve the technical problems of film poor coating caused by particles and the like, thereby avoiding encapsulation performance failure.

The technical solutions of the present application also improve the property of surface coverage of the encapsulation film, and effectively prevent moisture in the organic film layer or in the air from penetrating into the display unit 120.

In addition, the present application further provides a display device including the display screen described above.

In the display device employing the technical solutions of the present application, the thermal expansion coefficient of the first encapsulation film is between the thermal expansion coefficient of the film layer immediately adjacent to the first encapsulation film on the display unit and the thermal expansion coefficient of the first atomic layer deposition film, therefore the first encapsulation film improves the interfacial properties of the film layers on both sides thereof, thereby avoiding the peeling and disintegration phenomenon of the first atomic layer deposition film due to the excessive difference between the thermal expansion coefficient of the first atomic layer deposition film and the thermal expansion coefficient of the film layer on the display unit, and improving the stability of the first atomic layer deposition film. Finally, the reliability of the overall encapsulation is improved, and the yield of the final product is improved.

First Comparative Example

The OLED display screen includes a substrate, a display unit and a thin film encapsulation structure which are disposed on the substrate. The thin film encapsulation structure of the OLED display screen of this comparative example includes a silicon oxide atomic layer deposition film, a first silicon nitride film layer, an organic thin film layer and a second silicon nitride film layer, which are stacked and disposed on the OLED display unit, and the corresponding thicknesses are 50 nm, 1 μm, 10 μm, and 1 μm respectively. The first silicon nitride film layer and the second silicon nitride film layer are both deposited by a CVD process.

Figure 2:
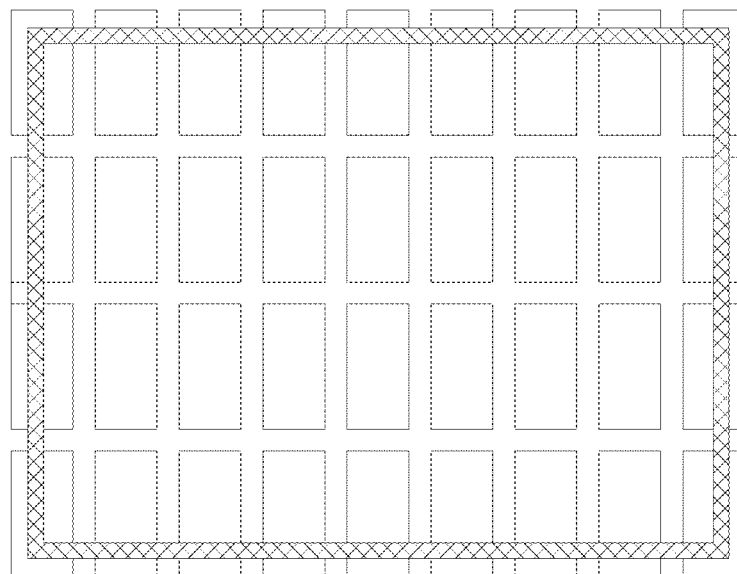
FIG. 2 is a schematic view of array units before forming a display screen of a first comparative example.

Referring to FIG. 2, several array units (configured to form the display screen) are arranged in four rows and nine columns. Peeling phenomena are easy to occur in the edge area (section line area), that is, the peeling phenomena occur in 22 array units of the 36 array units, and the defect rate is as high as 61.1%.

Second Comparative Example

The thin film encapsulation structure of the OLED display screen of a second comparative example includes a silicon oxide atomic layer deposition film, a first silicon nitride film layer, an organic thin film layer and a second silicon nitride film layer, which are sequentially stacked and disposed on the OLED display unit, and the thicknesses are 50 nm, 1 μm, 10 μm, and 1 μm respectively. Where the first silicon nitride film layer and the second silicon nitride film layer are both deposited by a CVD process.

Figure 3A:
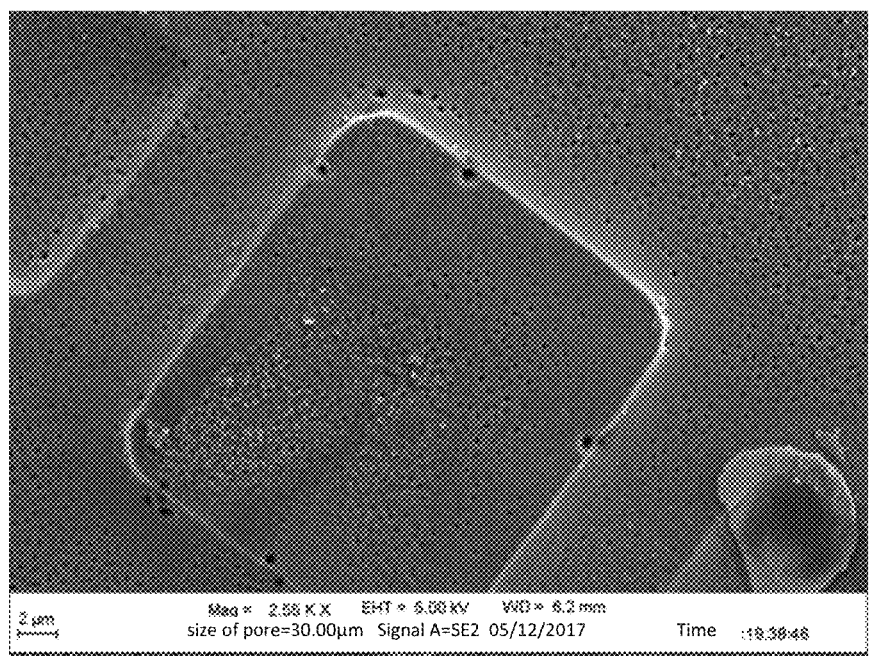
FIG. 3 (A) is a scanning electron microscope (SEM) image of a surface of a thin film encapsulation structure of a display screen of a second comparative example, where the surface is adjacent to the display unit.
Figure 3B:
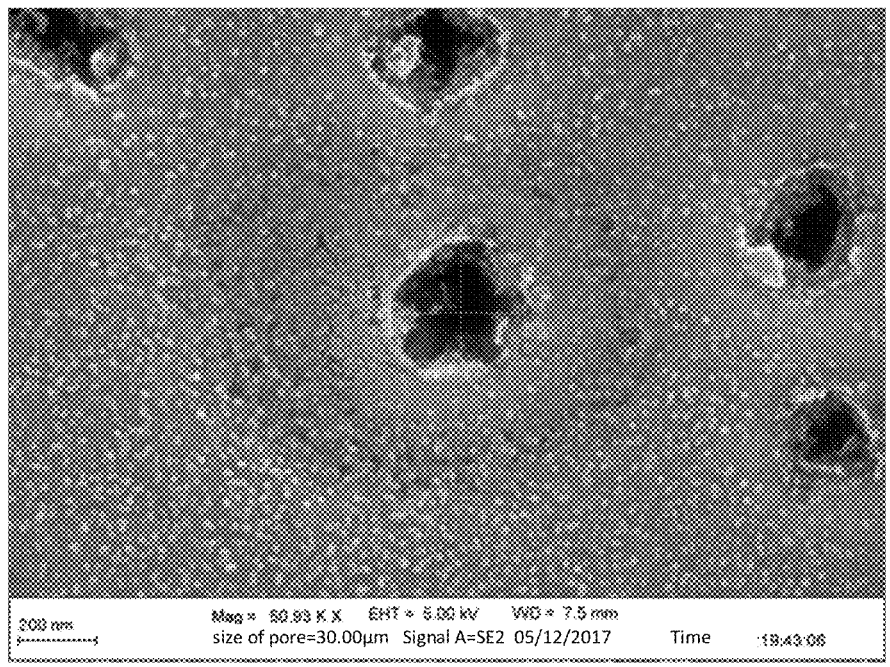

The surface of the thin film encapsulation structure of the OLED display screen of the second comparative example was characterized by scanning electron microscopy (SEM) to obtain FIG. 3(*a*) and FIG. 3(*b*), where the surface is adjacent to the display unit. As can be seen from FIG. 3(*a*) and FIG. 3(*b*), pores with diameters from 200 to 1000 nm are densely distributed in the thin film encapsulation structure of the second comparative example and the film layer around each of the pores is not dense and is in a snowflake-like shape.

Figure 4:
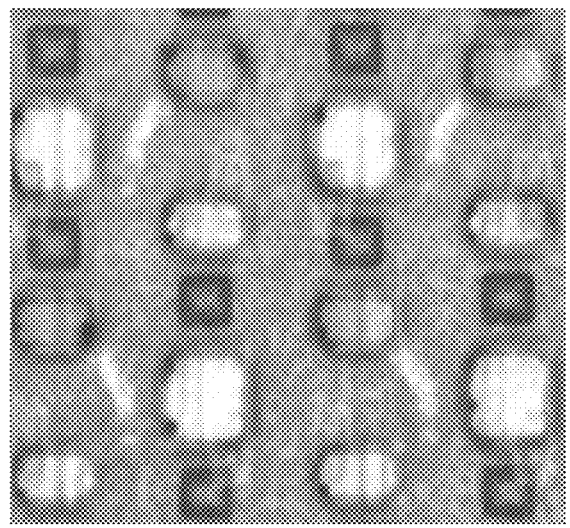
FIG. 4 is a photograph of the display screen taken by AOI (Automatic Optic Inspection) according to the second comparative example.
Figure 5:
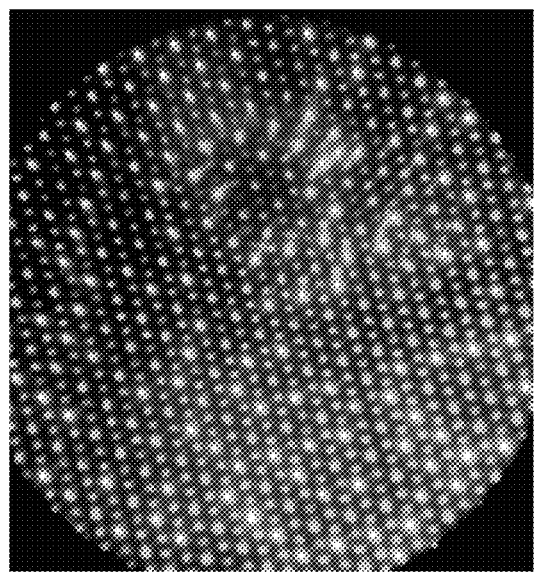
FIG. 5 is a photomicrograph of the display screen of the second comparative example.
Figure 6:
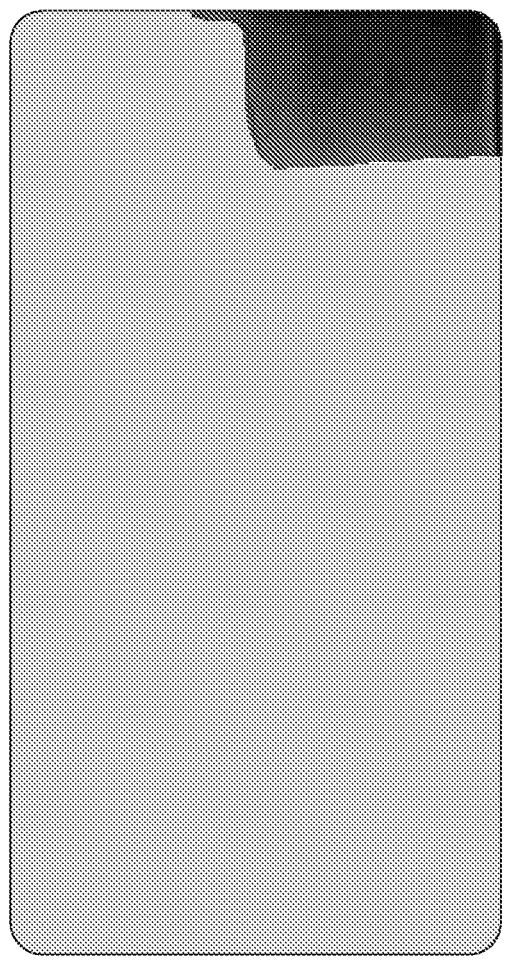
FIG. 6 is a normally taken photograph of the display screen of the second comparative example.

The OLED display screen of the comparative example is respectively photographed by AOI, microscope, and photographed normally to obtain FIGS. 4, 5, and 6. As can be seen from FIG. 4, there are several small black dots on the OLED display screen of the comparative example. As can be seen from FIG. 5, the brightness of several pixels of the OLED display screen of the comparative example is uneven. As can be seen from FIG. 6, the brightness of the displayed picture of the OLED display screen of the second comparative example is uneven, and there is a dark area in the upper right corner.

First Embodiment

The OLED display screen of the present embodiment differs from the OLED display screen of the first comparative example in that: a first encapsulation film having a thickness of 50 nm is disposed between the OLED display unit and the silicon oxide atomic layer deposition film, and the first encapsulation film is a silicon oxynitride encapsulation film deposited by a CVD process.

Figure 7:
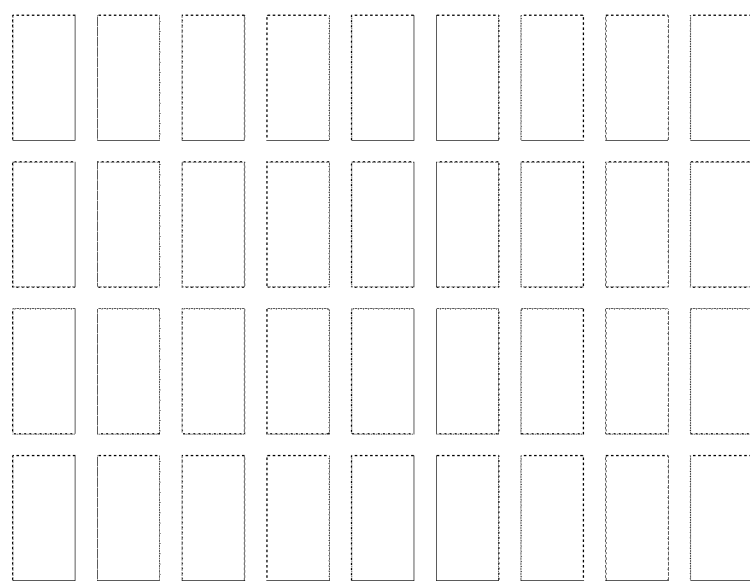
FIG. 7 is a schematic view of array units before forming the display screen of a first embodiment of the present application.

Referring to FIG. 7, no peeling phenomena occur in the edge area of several array units of the present embodiment.

Second Embodiment

The OLED display screen of the second embodiment differs from the OLED display screen of the second comparative example in that: a first encapsulation film having a thickness of 50 nm is disposed between the OLED display screen and the silicon oxide atomic layer deposition film, and the first encapsulation film is a silicon nitride encapsulation film deposited by a CVD process.

Figure 8:
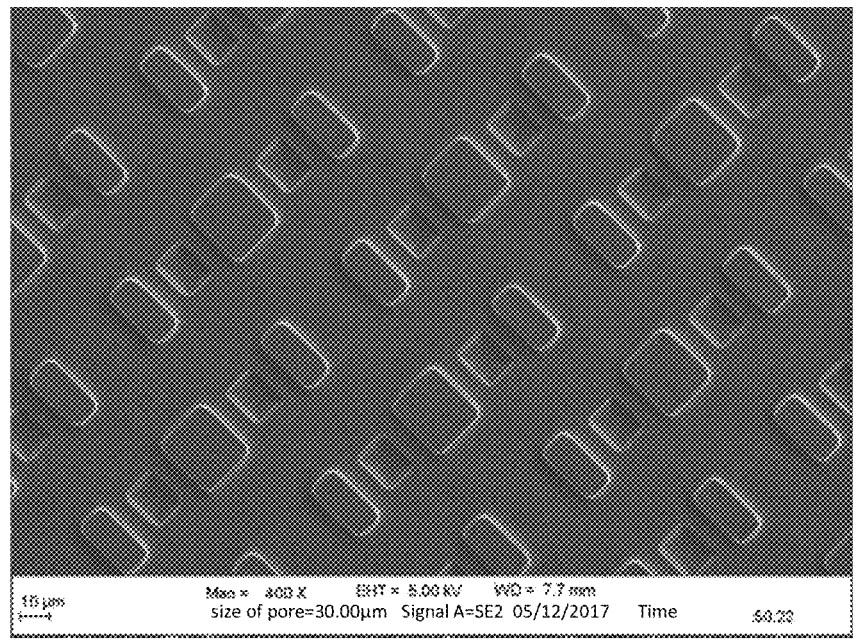
FIG. 8 is a scanning electron microscope (SEM) image of the surface of the thin film encapsulation structure of the display screen according to a second embodiment of the present application, where the surface is adjacent to the display unit.

The surface of the thin film encapsulation structure of the OLED display screen of the second embodiment was characterized by scanning electron microscopy (SEM) to obtain FIG. 8, where the surface is adjacent to the display device. As can be seen from FIG. 8, the surface of the thin film encapsulation structure of the second embodiment is flat and free from abnormalities.

Figure 9:
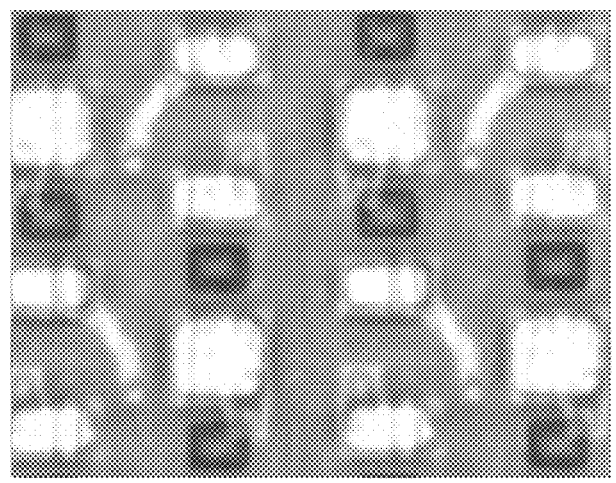
FIG. 9 is a photograph of the display screen taken by AOI according to the second embodiment of the present application.
Figure 10:
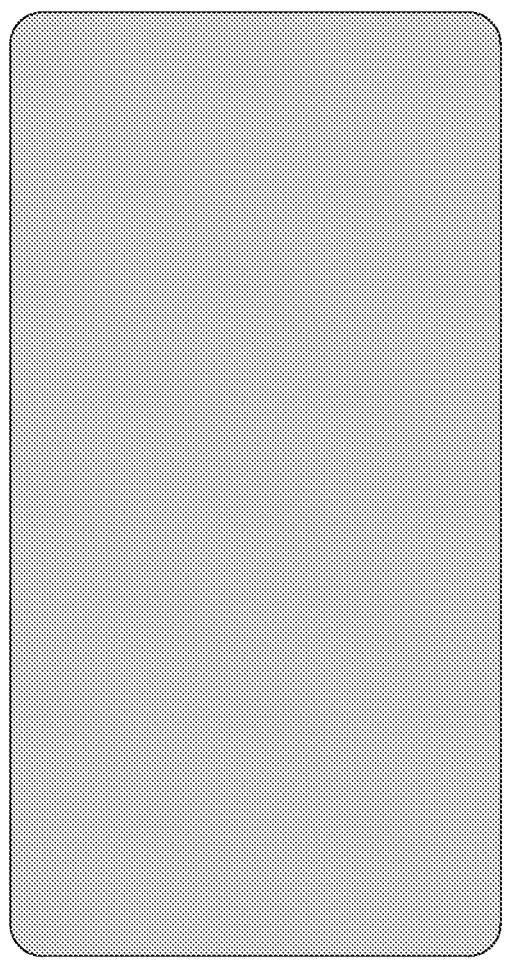
FIG. 10 is a normally taken photograph of the display screen according to the second embodiment of the present application.

The OLED display screen of the second embodiment is respectively photographed by AOI and photographed normally to obtain FIGS. 9 and 10. As can be seen from FIG. 9, there are no small black dots on the OLED display screen of the second embodiment, and the brightness of several pixels is even. As can be seen from FIG. 10, the brightness of the displayed picture of the OLED display screen of the second embodiment is even, and there are no dark areas.

Each of the technical features of the above described embodiments can be combined arbitrarily, and to simplify the description, not all possible combinations of the technical features of the above embodiments are described. However, all combinations of these technical features should be considered to be within the scope of the description, as long as such combinations do not conflict with each other.

The invention claimed is:
1. A display screen, comprising:
a substrate;
a display unit positioned on the substrate and comprising a plurality of film layers; and a thin film encapsulation structure positioned on a side of the display unit away from the substrate, the thin film encapsulation structure comprising a first encapsulation film positioned on the display unit, and a first atomic layer deposition film positioned on the first encapsulation film;

wherein a thermal expansion coefficient of the first encapsulation film is between a thermal expansion coefficient of a film layer adjacent to the first encapsulation film on the display unit and a thermal expansion coefficient of the first atomic layer deposition film;

wherein the first encapsulation film is a first vapor deposition film or a first sputtering film;

wherein the first vapor deposition film is a film layer deposited by a chemical vapor deposition process or a film layer deposited by a physical vapor deposition process, and the first sputtering film is a film layer obtained by a sputtering process.

2. The display screen according to claim 1, wherein the substrate is a flexible substrate.

3. The display screen according to claim 1, wherein the first encapsulation film is a silicon nitride encapsulation film or a silicon oxynitride encapsulation film.

4. The display screen according to claim 1, wherein the first encapsulation film has a thickness in a range from 20 nm to 1000 nm.

5. The display screen according to claim 1, wherein a compressive stress of the first encapsulation film is in a range from 10 MPa to 100 MPa.

6. The display screen according to claim 1, wherein the first encapsulation film has a roughness of 30 Å.

7. The display screen according to claim 1, wherein the first atomic layer deposition film is a metal oxide atomic layer deposition film or a non-metal oxide atomic layer deposition film.

8. The display screen according to claim 1, wherein the first atomic layer deposition film is any one of an aluminum oxide atomic layer deposition film, a zirconium oxide atomic layer deposition film, a silicon nitride atomic layer deposition film, and a silicon oxide atomic layer deposition film.

9. The display screen according to claim 1, wherein the first atomic layer deposition film has a thickness in a range from 30 nm to 200 nm.

10. The display screen according to claim 1, wherein the first atomic layer deposition film has a thickness of 50 nm, a stress of 200 MPa, and a roughness of 3 Å.

11. The display screen according to claim 1, wherein the thin film encapsulation structure further comprises a second encapsulation film disposed on the first atomic layer deposition film; the second encapsulation film comprises at least one inorganic thin film layer and at least one organic thin film which are stacked; and the inorganic thin film layer is a vapor deposition film or a second atomic layer deposition film.

12. The display screen according to claim 11, wherein the vapor deposition film has a thickness in a range from 700 nm to 1,200 nm.

13. The display screen according to claim 11, wherein the second atomic layer deposition film has a thickness in a range from 30 nm to 200 nm.

14. The display screen according to claim 11, wherein the organic thin film layer has a thickness in a range from 5 μm to 12 μm.

15. The display screen according to claim 11, wherein the second encapsulation film comprises two inorganic film layers, and one organic film layer disposed between the two inorganic film layers.

16. The display screen according to claim 1, wherein the thin film encapsulation structure further comprises a second encapsulation film disposed on the first atomic layer deposition film; the second encapsulation film comprises an organic thin film layer, and an inorganic thin film layer disposed on the organic thin film layer.

17. The display screen according to claim 2, wherein the substrate is a polyimide substrate, a polyamide substrate, a polycarbonate substrate, or a polyether sulfone substrate.

18. A display screen, comprising:
a substrate;
a display unit positioned on the substrate and comprising a plurality of film layers; and
a thin film encapsulation structure positioned on a side of the display unit away from the substrate, the thin film encapsulation structure comprising a first encapsulation film positioned on the display unit, and a first atomic layer deposition film positioned on the first encapsulation film;
wherein a thermal expansion coefficient of the first encapsulation film is between a thermal expansion coefficient of a film layer adjacent to the first encapsulation film on the display unit and a thermal expansion coefficient of the first atomic layer deposition film,
wherein the thin film encapsulation structure further comprises a second encapsulation film disposed on the first atomic layer deposition film; the second encapsulation film comprises at least one inorganic thin film layer and at least one organic thin film which are stacked; and the inorganic thin film layer is a vapor deposition film or a second atomic layer deposition film.

19. A display screen, comprising:
a substrate;
a display unit positioned on the substrate and comprising a plurality of film layers; and
a thin film encapsulation structure positioned on a side of the display unit away from the substrate, the thin film encapsulation structure comprising a first encapsulation film positioned on the display unit, and a first atomic layer deposition film positioned on the first encapsulation film;
wherein a thermal expansion coefficient of the first encapsulation film is between a thermal expansion coefficient of a film layer adjacent to the first encapsulation film on the display unit and a thermal expansion coefficient of the first atomic layer deposition film;
wherein the substrate is a flexible substrate;
wherein the substrate is a polyimide substrate, a polyamide substrate, a polycarbonate substrate, or a polyether sulfone substrate.

* * * * *